United States Patent
Ramos et al.

(10) Patent No.: US 6,224,678 B1
(45) Date of Patent: May 1, 2001

(54) MODIFIED THERMOCOUPLE MOUNTING BUSHING AND SYSTEM INCLUDING THE SAME

(75) Inventors: Jesse C. Ramos, Austin; Blake A. Foster, Wimberley; Allan T. Nelson, Bastrop, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/132,831

(22) Filed: Aug. 12, 1998

(51) Int. Cl.$^7$ .................................................. C23C 16/00
(52) U.S. Cl. ............................ 118/715; 118/725; 118/724
(58) Field of Search ..................................... 118/718, 724, 118/725, 715; 136/230

(56) References Cited

U.S. PATENT DOCUMENTS

| | | | |
|---|---|---|---|
| 3,765,242 | * 10/1973 | Bailleu .................................. | 136/230 |
| 4,448,149 | * 5/1984 | Brown, Jr. et al. ................... | 118/500 |
| 4,871,263 | * 10/1989 | Wilson ................................. | 136/230 |
| 4,975,123 | * 12/1990 | Gray ..................................... | 123/230 |
| 5,461,214 | * 10/1995 | Peck et al. ............................ | 219/390 |
| 5,462,603 | 10/1995 | Murakami . | |
| 5,490,228 | * 2/1996 | Soma et al. ........................... | 392/416 |
| 5,578,132 | * 11/1996 | Yamage et al. ....................... | 118/724 |
| 5,855,677 | * 1/1999 | Carlson et al. ....................... | 118/666 |

OTHER PUBLICATIONS

Wolf, et al., "Silicon Processing for the VLSI Era, vol. 1: Process Technology," *Lattice Press 1986*, pp. 161–234.

* cited by examiner

Primary Examiner—Jeffrie R. Lund
Assistant Examiner—Sylvia R. MacArthur
(74) Attorney, Agent, or Firm—Kevin L. Daffer; Conley, Rose & Tayon P.C.

(57) ABSTRACT

An LPCVD system is provided in which a thermocouple mounting system is configured to inhibit motion of a thermocouple with respect to an LPCVD reactor. The thermocouple mounting system includes an improved thermocouple mounting bushing that forms a fixable engagement with a thermocouple mounting hub. The thermocouple mounting bushing compresses a clip ring against both the thermocouple and the thermocouple mounting hub during use to inhibit motion of the thermocouple. The improved thermocouple mounting system inhibits contact between the thermocouple and a quartz liner within the reactor during use, thus minimizing formation of contaminating particles. The thermocouple mounting system further maintains the thermocouple in proper alignment according to design criteria such that accurate temperature readings are supplied to a temperature controller during use. In addition, the improved thermocouple mounting system prevents the thermocouple from being pulled into the reactor during use in the event an O-ring, also part of the thermocouple mounting system, is weakened or fails.

17 Claims, 4 Drawing Sheets

MODIFIED THERMOCOUPLE MOUNTING BUSHING AND SYSTEM INCLUDING THE SAME

BACKGROUND OF THE INVENTION

1. Field of the Invention

This invention relates to integrated circuit fabrication and, more particularly, to a chemical vapor deposition system employing a thermocouple mounting system designed to inhibit contact between the thermocouple and a quartz liner within the chemical vapor deposition system.

2. Description of the Related Art

Chemical vapor deposition ("CVD") is a well-known process employed during the fabrication of an integrated circuit to deposit a thin film upon a substrate. A CVD process typically involves forming a non-volatile solid film (e.g., silicon dioxide, silicon nitride, polycrystalline silicon) on a substrate by reacting vapor phase chemicals that contain the required constituents. For example, silicon dioxide may be formed upon a semiconductor substrate by reacting silane and oxygen or by thermally decomposing tetraethylorthosilicate (TEOS). The thin film is formed by introducing the reactant gases into a reaction chamber and then decomposing the reactants and reacting them at a heated surface. Various inert carrier gases (e.g., $H_2$, $N_2$, Ar) may be used to carry the reactive gases into the chamber. The gaseous by-products of the reaction are desorbed and removed from the reaction chamber, along with the unconsumed reactant gases and the inert carrier gases.

The CVD process can take place in either pressurized or non-pressurized reaction chambers. Due to the stringent requirements of film uniformity, low-pressure chemical vapor deposition ("LPCVD") reactors have gained in popularity. LPCVD reactors generally operate in the pressure range of 0.1 to 10 torr and the temperature range of 500 to 600° C. As such, the rate at which a solid film is formed at the surface of a semiconductor substrate is typically limited by the rate at which the reactant gases react rather than by the rate at which the reactant gases are supplied to the substrate by mass transport. By eliminating mass-transfer constraints on reactor design, the reactor may be optimized for high wafer capacity. In addition, low-pressure operation decreases gas-phase reactions, making LPCVD films less subject to particulate contamination.

Surface reaction rate is very sensitive to temperature, as shown by the following equation:

$$R = R_0 e^{(-E_a/kT)}$$

in which R is the rate of reaction, $R_0$ is the frequency factor, $E_a$ is the activation energy in eV, k is Boltzmann's constant, and T is the temperature in Kelvin. As such, precise temperature control is essential in an LPCVD reactor. Typically, the temperature control system receives data from thermocouples and adjusts power to furnace heating elements to maintain the temperature at a predetermined set point. Modem systems are capable of controlling temperatures over the range of about 300–1200° C. to an accuracy of about ±0.5° C. over a length of up to 40 inches (the "flat zone").

Horizontal tube reactors are commonly used as LPCVD reactors because of their superior economy, throughput, uniformity, and ability to accommodate large-diameter (e.g., 150 mm) wafers. Horizontal reactors are, however, susceptible to particulate contamination of wafers placed in them. Wafers are aligned vertically and stacked in quartz racks or "boats" that support the wafers. A fused silica paddle supports the boats and is used to position the boats within the reactor. Considerable particle generation can occur when boat-laden paddles are dragged along the furnace tube during loading and unloading. The particles can land on the wafers and result in defects if particles become embedded in the growing film. The use of wheeled carriers can serve to somewhat reduce the generation of particles, but friction at the wheel bearings and movement of the wheels over the tube surface can still generate particles.

Greater reduction in the number of generated particles can be achieved by using suspended loading systems. In fully suspended loading systems, the boats and paddles are suspended at the end of a motor-driven rod and pushed into the furnace without touching the process tube walls. During processing the wafers remain suspended, and upon completion of processing the wafers are removed from the reactor, again without touching the walls of the tube. Soft-landing systems carry the boats into the process tube, lower the boats until the tube supports them, and then withdraw, leaving behind the boats and wafers. The paddles may remain within the tube or be withdrawn. Upon completion of processing, the boats and wafers are removed from the tube without touching the tube walls.

A recent innovation in furnace technology is the vertical furnace. In a vertical furnace, the wafers are also stacked side-by-side but are oriented horizontally rather than vertically (as in horizontal furnaces). The wafers are placed in boats or in perforated-quartz cages. The vertical orientation inhibits contact between the boats and the tube walls, and thus the formation of particles, without the use of suspended loading systems. Use of a vertical furnace may not completely eliminate particle formation, however. Vertical furnaces may include a quartz liner placed between the wall of the reactor and the quartz boat holding the wafers. The quartz liner may be used to confine the process gases in close proximity to the wafers during film formation. The thermocouple used to measure temperature within the furnace often includes an elongated housing placed between the wall of the furnace and the quartz liner with very close tolerance. If the thermocouple is misaligned, contact between the thermocouple and the quartz liner may cause formation of quartz particles that can contaminate the wafers. Further, such misalignment can result in incorrect temperature profiles because the temperature is being measured farther from the heating elements than called for by the furnace design criteria.

As an example, the Model Alpha 585S LPCVD reactor manufactured by Tokyo Electron Limited (Tokyo, Japan) includes a thermocouple housing inserted through an opening in the sidewall of the reactor and secured in place by an O-ring. FIG. 1 depicts a cross-sectional view of the reactor. Thermocouple 14 is inserted through manifold 16 and resides between sidewall 12 of reactor 10 and quartz liner 20. FIG. 2 is an enlarged view of the circled portion of FIG. 1. Thermocouple 14 is secured to manifold 16 by thermocouple mounting system 11 as follows: O-ring 22 is placed over the end of thermocouple 14 and secured in place with O-ring compression ring 24 and thermocouple mounting hub 26 to form a seal to preserve vacuum when reactor 10 is evacuated. Manifold 16 and thermocouple mounting hub 26 include threaded portions 18 and 28, respectively, that are complementarily threaded to form an engagement when thermocouple mounting hub 26 is screwed onto manifold 16. Clip ring 32 is then placed over notch 34 in the end of thermocouple 14, and thermocouple mounting bushing 36 is coupled to the mounting hub. Thermocouple mounting hub 26 and thermocouple mounting bushing 36 include threaded surfaces 32 and 40, respectively, that are complementarily threaded to form an engagement when thermocouple mounting bushing 36 is screwed onto thermocouple mounting hub 26.

As currently configured, thermocouple 14 is held in place essentially only by the engagement formed between manifold 16, O-ring 22, compression ring 24, and mounting hub 26. The design of thermocouple mounting bushing 36 allows only a weak, if any, engagement between the bushing and clip ring 32. Consequently, thermocouple 14 may wobble or move within manifold 16, and thermocouple 14 may shift as much as 2 or 3 inches at the end opposite manifold 16. As a result, contact between thermocouple 14 and quartz liner 20 may dislodge quartz particles from the boat and contaminate wafers contained within reactor 10.

In addition, when reactor 10 is used as part of a solvent-based TEOS system, the solvent may lubricate O-ring 22 and render thermocouple 14 mobile when the system is placed under vacuum. As such, the evacuation process may pull thermocouple 14 into quartz liner 20, cracking the quartz liner and necessitating replacement of one or both components. Further, if sufficient vacuum is created before O-ring 22 fails, the pressure differential between the exterior and the interior of reactor 10 may be sufficient to push thermocouple 14 completely into the reactor, thus voiding the vacuum and causing rupture or implosion of the reactor. Catastrophic failure of the reactor could result not only in economic losses due to loss of production capacity and the need to replace the equipment, but potentially in injury to workers near the reactor when the failure occurred.

It would therefore be desirable to develop a thermocouple mounting system that overcomes deficiencies of the current system. In particular, an improved thermocouple mounting system would include at least two points of contact between the thermocouple and the wall of the reactor. Such a configuration would inhibit wobbling or motion of the thermocouple within the reactor so that accurate temperature profiles are obtained and formation of quartz particles is inhibited. The improved mounting system would also be configured to maintain engagement between the thermocouple and the reactor in the event of O-ring failure.

SUMMARY OF THE INVENTION

The problems outlined above are in large part solved by the LPCVD system hereof in which a thermocouple mounting system is configured to inhibit motion of the thermocouple with respect to the LPCVD reactor. The thermocouple mounting system preferably includes an O-ring, an O-ring compression ring, a thermocouple mounting hub, and a ring clip similar to the mounting system of the prior art. In addition, the thermocouple mounting system preferably includes a thermocouple mounting bushing with an opening formed therethrough. The opening preferably has a first portion having a uniform inner diameter and a second portion having a graded inner diameter. The graded inner diameter preferably decreases with increasing proximity to the end of the thermocouple housing (i.e., with increasing distance from the wall of the reactor). In an embodiment, the surface of the opening includes threading in the first portion but is substantially unthreaded in the second portion.

The O-ring and the O-ring compression ring are preferably placed around the thermocouple. A fixable engagement is then formed between the thermocouple mounting hub and a manifold portion of the LPCVD reactor to secure the thermocouple. The clip ring is then placed within a notch in the thermocouple and a fixable engagement is formed between the thermocouple mounting bushing and the thermocouple mounting hub. The unthreaded portion of the opening in the thermocouple mounting bushing preferably compresses the clip ring against both the thermocouple and the thermocouple mounting hub to further secure the thermocouple. As such, the thermocouple is secured at two locations (i.e., by both the O-ring and the clip ring), rather than one as in the prior art system. Motion of the thermocouple with respect to the reactor should therefore be further inhibited. In addition, use of the thermocouple mounting system of the present invention may prevent catastrophic failure of the reactor in the event of damage to the O-ring.

BRIEF DESCRIPTION OF THE DRAWINGS

Further advantages of the present invention will become apparent to those skilled in the art upon reading the following description of the preferred embodiments and upon reference to the accompanying drawings in which.

Figure 1:
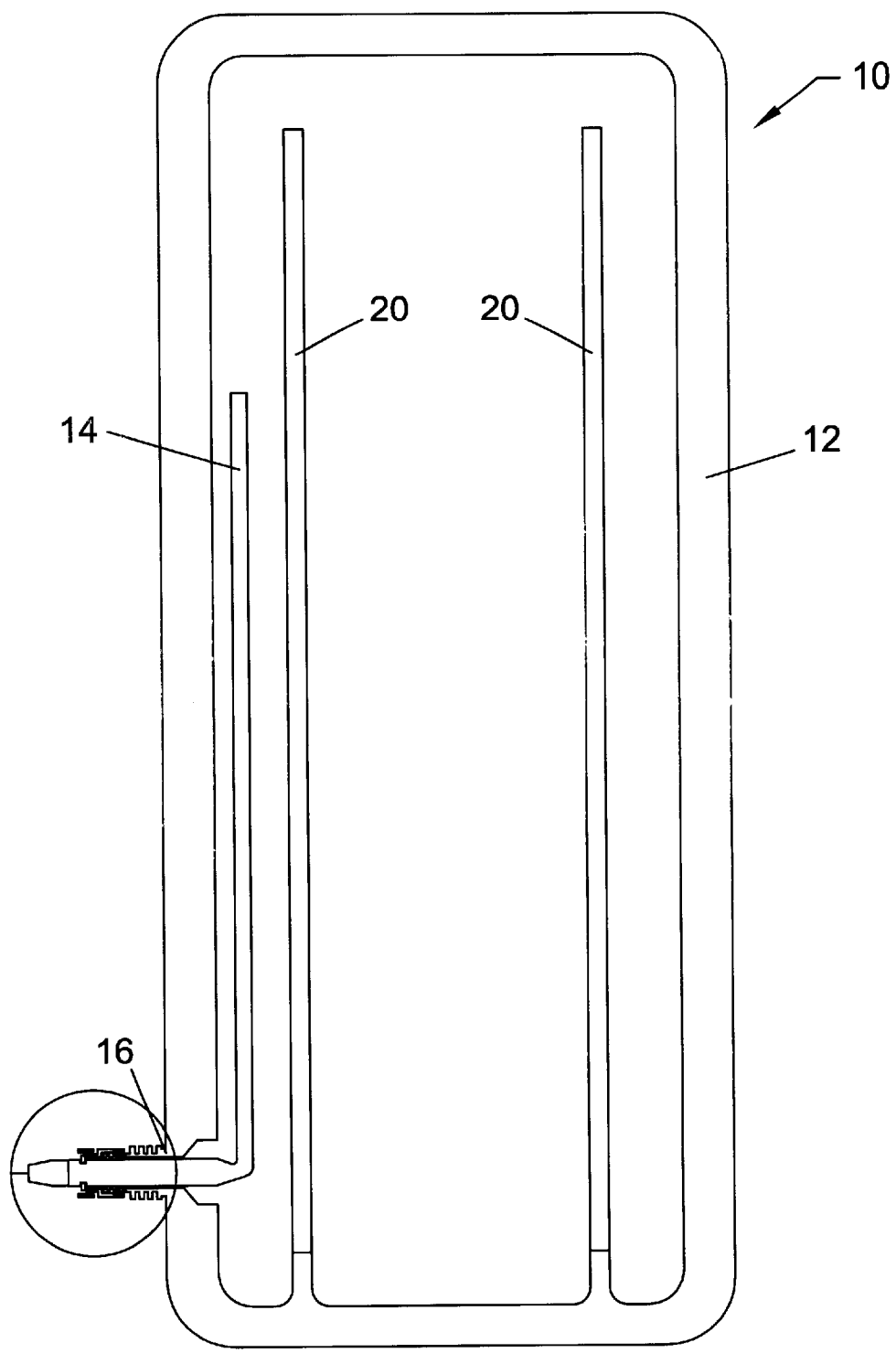
FIG. 1 is a cross-sectional view of a conventional LPCVD system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figures 3, 4:
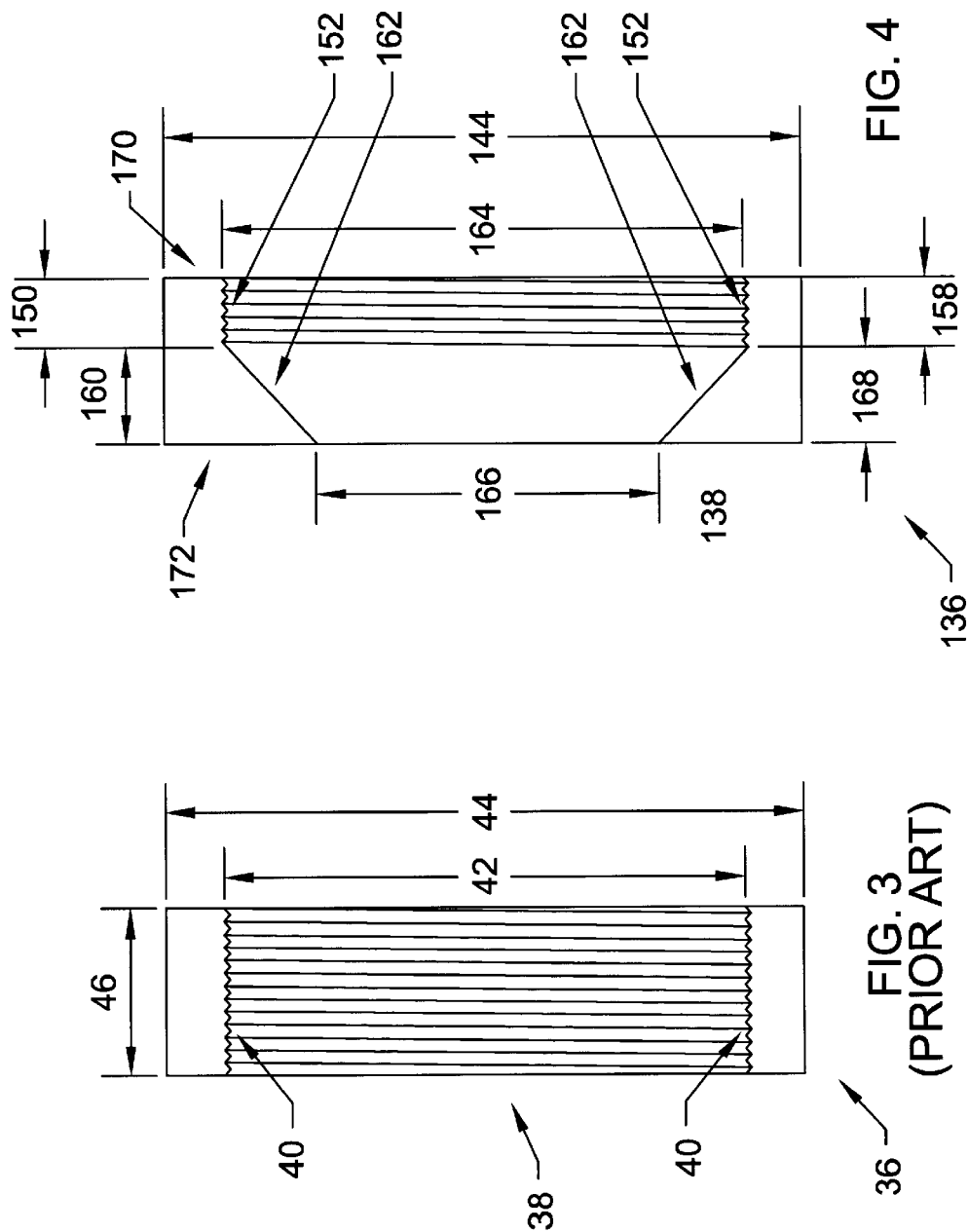
FIG. 3 is a cross-sectional view of a thermocouple mounting bushing of the thermocouple mounting system depicted in FIG. 2.
FIG. 4 is a cross-sectional view of a thermocouple mounting bushing according to an embodiment of the present invention.

FIGS. 3 and 4 depict cross-sectional views of the thermocouple mounting bushings of the prior art and the present invention, respectively. Opening 38 extends longitudinally through prior-art bushing 36 (FIG. 3). Inner surface 40 of opening 38 includes threading. In an embodiment, opening 38 is substantially cylindrical and may have an inner diameter 42 of about 28.5 mm, an outer diameter 44 of about 39 mm, and a length 46 of about 9 mm.

In contrast, bushing 136 (FIG. 4) of the present invention includes first portion 150 and second portion 160. Opening 138 extends longitudinally through first portion 150 and second portion 160. In an embodiment, inner surface 152 of opening 138 in first portion 150 includes threading, while inner surface 162 of opening 138 is preferably unthreaded in second portion 160. Further, opening 138 preferably varies in diameter through second portion 160 between first end 170 and second end 172 such that first inner diameter 164 is greater than second inner diameter 166. In an embodiment, length 158 of first portion 150 is about 4 mm and first inner diameter 164 is about 28.5 mm. In such an embodiment, length 168 of second portion 160 is preferably about 5.5 mm and second inner diameter 166 is preferably about 25 mm. Outer diameter 144 is preferably about 39 mm.

Figure 2:
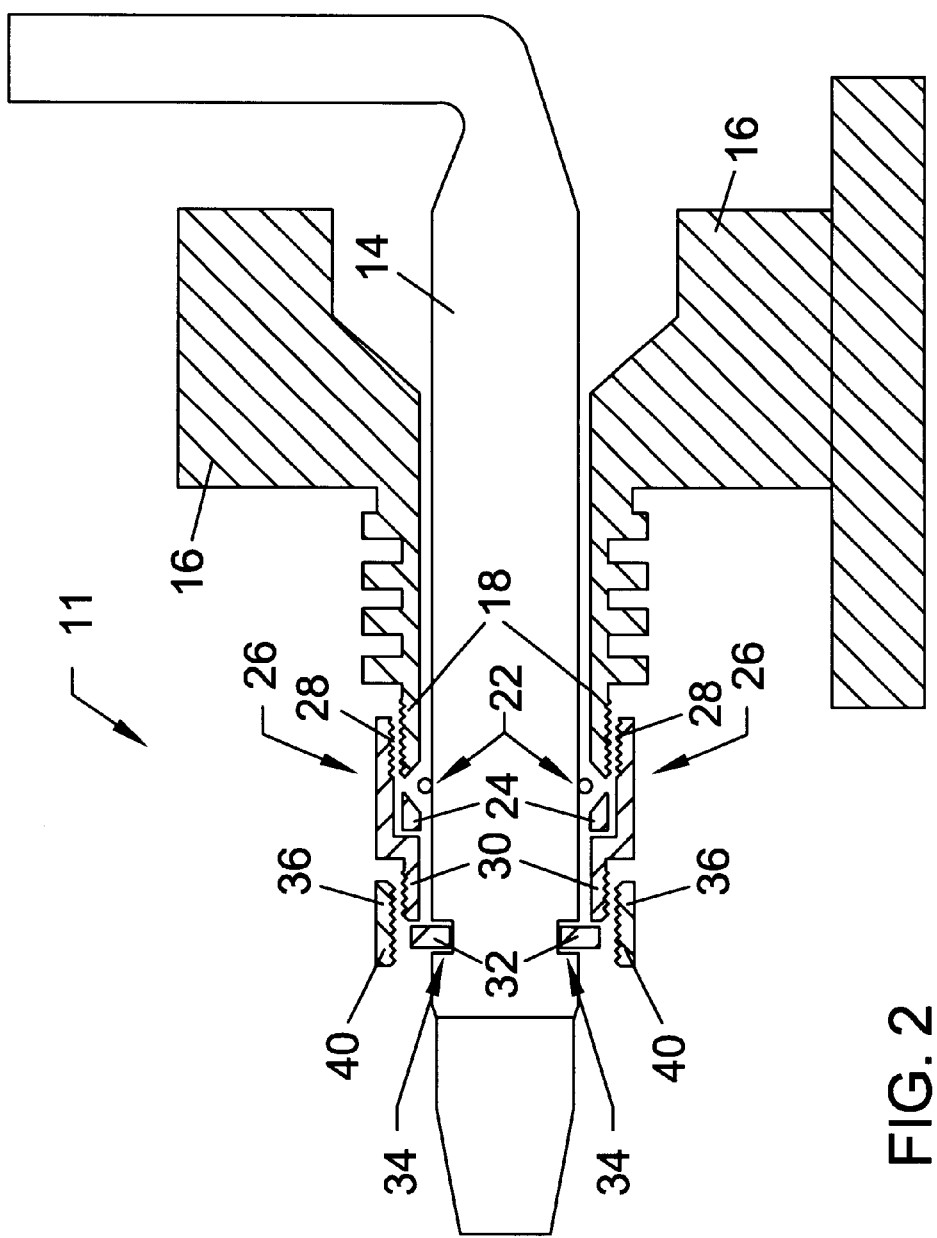
FIG. 2 is a cross-sectional view of a thermocouple mounting system of the LPCVD system of FIG. 1.
Figure 5:
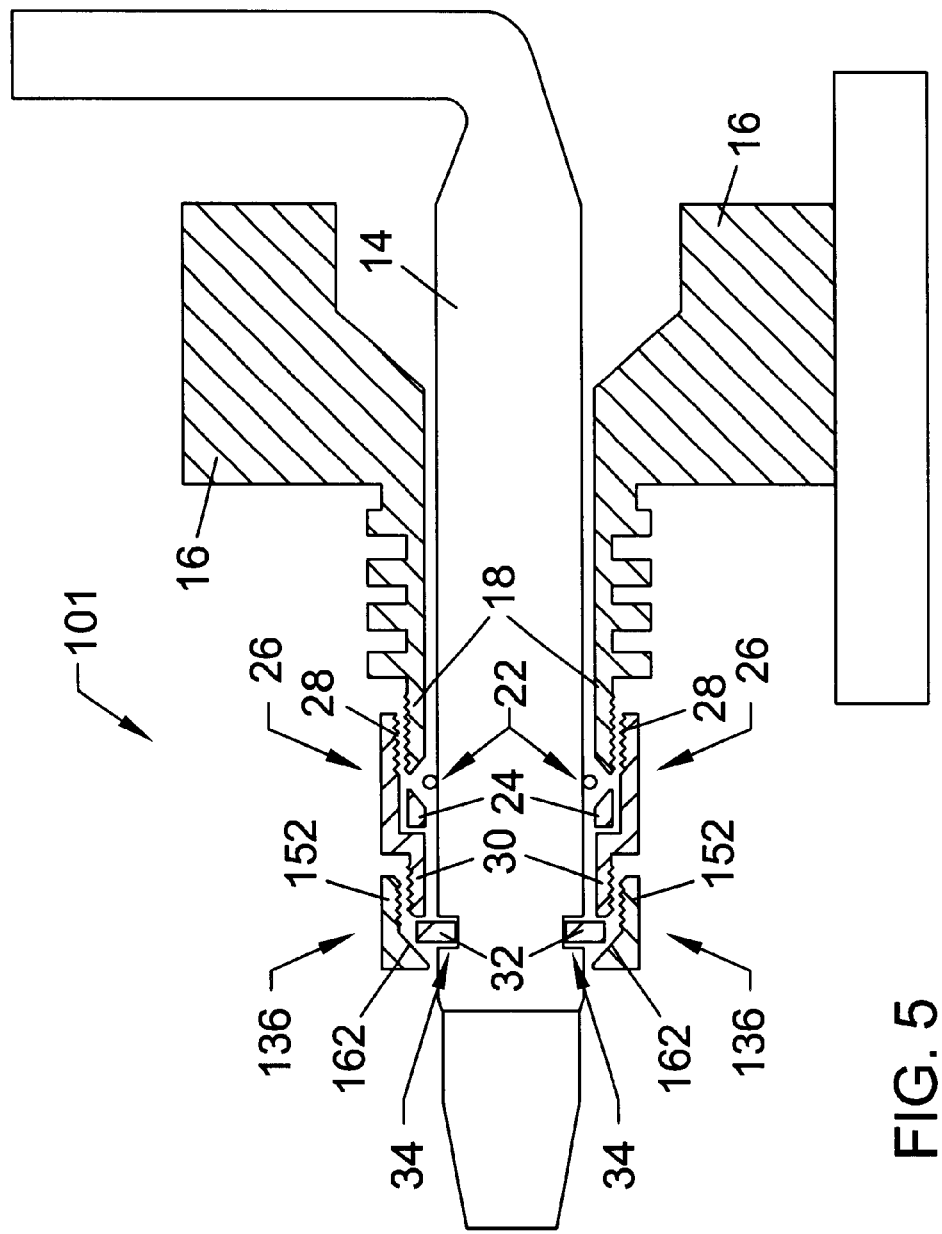
FIG. 5 is a cross-sectional view of a thermocouple mounting system of an LPCVD system including the thermocouple mounting bushing depicted in FIG. 4.

Turning now to FIG. 5, a thermocouple mounting system including a thermocouple mounting bushing according to an embodiment of the present invention is depicted. Thermocouple mounting system 101 couples thermocouple 14 to manifold 16 and includes O-ring 22, O-ring compression ring 24, thermocouple mounting hub 26, and clip ring 32, as described for thermocouple mounting system 11 depicted in FIG. 2. Thermocouple mounting system 101 further includes thermocouple mounting bushing 136. In an embodiment, bushing 136 comprises stainless steel and clip ring 32 comprises polytetrafluoroethylene.

As depicted in FIG. 5, thermocouple 14 is secured to manifold 16 by thermocouple mounting system 101 as follows: O-ring 22 is placed over the end of thermocouple 14 and secured in place with O-ring compression ring 24 and thermocouple mounting hub 26 as described above for thermocouple mounting system 11 (FIG. 2). Clip ring 32 is then placed over notch 34 in thermocouple 14 and secured in place with thermocouple mounting bushing 136. Thermocouple mounting hub 26 and thermocouple mounting bushing 136 include threaded portions 30 and 152, respectively, that are complementarily threaded to form an engagement when thermocouple mounting bushing 136 is screwed onto thermocouple mounting hub 26.

Bushing 136 is configured to form an engagement with the clip ring as well. As bushing 136 is screwed onto mounting hub 26, inner surface 162 of second portion 160 presses against clip ring 32. Clip ring 32 is thereby compressed both radially against thermocouple 14 (in notch 34) and laterally against mounting hub 26. Thermocouple 14 is thereby secured in two places (by O-ring 22 and clip ring 32) such that motion of the thermocouple is inhibited, thus minimizing contact with the quartz liner of the reactor and formation of particulate contaminants. In addition, if O-ring 22 were to fail or become loosened, the present thermocouple mounting system is configured to prevent the thermocouple from being pulled into the reactor during evacuation of the reactor.

It will be appreciated to those skilled in the art having the benefit of this disclosure that this invention is believed to provide a chemical vapor deposition system including a thermocouple mounting system having an improved thermocouple mounting bushing. The mounting bushing is configured to inhibit contact between a thermocouple and a quartz liner during use, thus minimizing formation of unwanted particulate contaminants. The mounting bushing is also configured to maintain an engagement between the thermocouple and the reactor vessel in the event an O-ring, also part of the mounting system, fails. The mounting bushing is further configured to maintain the thermocouple position according to reactor design criteria, thus ensuring accurate process temperature measurements and minimizing the need for process corrections. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A thermocouple mounting bushing configured to inhibit contact between a thermocouple and a portion of a reaction chamber, the thermocouple mounting bushing forming an opening therethrough for receiving a thermocouple, wherein the thermocouple mounting bushing consisting essentially of:

a first section having a first length, wherein said opening comprises a first inner surface and a first inner diameter in said first section;

a second section having a second length, wherein said opening comprises a second inner surface and a second inner diameter in said second section, wherein said second inner diameter continuously varies in a direction from a first end of said second section to a second end of said second section, wherein no two diameters along said second inner surface are equal; and an outer diameter of the first and second sections being a constant dimension encompassing said first and second sections, wherein the thermocouple mounting bushing inhibits contact between the thermocouple and a portion of a reaction chamber.

2. The thermocouple mounting bushing as recited in claim 1, wherein the first and second sections comprise stainless steel.

3. The thermocouple mounting bushing of claim 1, wherein the first inner diameter is approximately 28.5 mm, the first length is approximately 4 mm, the second length is approximately 5.5 mm, and the second diameter varies from approximately 28.5 mm at the first end of the second section to approximately 25 mm at the second end of the second section.

4. The thermocouple mounting bushing of claim 1, wherein the thermocouple mounting bushing is configured to form a fixable engagement with a thermocouple mounting hub.

5. The thermocouple mounting bushing of claim 1, wherein said portion of a reaction chamber comprises a quartz liner.

6. The thermocouple mounting bushing of claim 1, wherein the first inner surface is threaded.

7. The thermocouple mounting bushing of claim 1, wherein the second inner surface is not threaded.

8. A thermocouple mounting system comprising:

a thermocouple mounting bushing having an opening extending therethrough, said thermocouple mounting bushing consisting essentially of:

a first section having a first length, wherein said opening has a first inner diameter in said first section;

a second section having a second length, wherein within said second section said opening has a second inner diameter continuously varying in a direction from a first end of the second section to a second end of the second section, wherein no two diameters along said second inner surface are equal; and an outer diameter of the first and second sections being a constant dimension encompassing said first and second sections, wherein the thermocouple mounting bushing inhibits contact between the thermocouple and a portion of a reaction chamber;

a thermocouple mounting hub; and a clip ring, wherein the thermocouple mounting bushing is configured to compress the clip ring against the thermocouple mounting hub and against the thermocouple during use, wherein the compression of the clip ring inhibits movement of the thermocouple.

9. The thermocouple mounting system of claim 8 wherein the second inner diameter is greater at the first end than at the second end.

10. The thermocouple mounting system of claim 8 wherein the thermocouple mounting bushing comprises stainless steel.

11. The thermocouple mounting bushing of claim 8 wherein the first length is approximately 4 mm, the first inner diameter is approximately 28.5 mm, the second length is approximately 5.5 mm, and the second inner diameter is approximately 28.5 mm at the first end of the first section and about 25 mm at the second end of the second section.

12. The thermocouple mounting system of claim 8 further comprising:
   an O-ring; and
   an O-ring compression ring.

13. The thermocouple mounting system of claim 12, wherein the thermocouple mounting hub is configured to compress the O-ring against a manifold during use.

14. The thermocouple mounting system of claim 13, wherein the thermocouple mounting system secures a thermocouple to a portion of a reaction chamber at two locations.

15. The thermocouple mounting system of claim 12 wherein the reaction chamber is a chemical vapor deposition chamber.

16. The thermocouple mounting system of claim 12, wherein the clip ring comprises polytetrafluoroethylene.

17. A reaction chamber for performing a chemical vapor deposition process, comprising:
   a quartz liner; and
   a thermocouple assembly, the thermocouple assembly comprising a thermocouple and a thermocouple mounting system;
   and wherein the thermocouple mounting system comprises a thermocouple mounting bushing, said thermocouple mounting bushing consisting essentially of:
      a first section having a first inner diameter and a first length;
      a second section having a second inner diameter and a second length, wherein the second inner diameter continuously varies in a direction from a first end of the second section to a second end of the second section, wherein no two diameters along said second inner surface are equal; and
      an outer diameter of the first and second sections being a constant dimension encompassing said first and second sections, wherein the thermocouple mounting bushing inhibits contact between the thermocouple and a portion of a reaction chamber.

* * * * *